(12) United States Patent
She

(10) Patent No.: US 11,887,865 B2
(45) Date of Patent: Jan. 30, 2024

(54) SYSTEM AND METHOD FOR MANUFACTURING A SEMICONDUCTOR PACKAGE STRUCTURE

(71) Applicant: Advanced Semiconductor Engineering, Inc., Kaohsiung (TW)

(72) Inventor: Chenghan She, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 341 days.

(21) Appl. No.: 17/086,189

(22) Filed: Oct. 30, 2020

(65) Prior Publication Data

US 2022/0139726 A1 May 5, 2022

(51) Int. Cl.
| | |
|---|---|
| *H01L 21/56* | (2006.01) |
| *B29C 43/34* | (2006.01) |
| *B29C 43/08* | (2006.01) |
| *H01L 21/67* | (2006.01) |
| *B29C 43/18* | (2006.01) |
| *B29L 31/34* | (2006.01) |
| *B29K 105/00* | (2006.01) |

(52) U.S. Cl.
CPC ............ *H01L 21/565* (2013.01); *B29C 43/18* (2013.01); *B29C 43/34* (2013.01); *H01L 21/568* (2013.01); *H01L 21/67126* (2013.01); *B29C 2043/3438* (2013.01); *B29K 2105/251* (2013.01); *B29L 2031/3406* (2013.01)

(58) Field of Classification Search
None
See application file for complete search history.

(56) References Cited

U.S. PATENT DOCUMENTS

| | | | | |
|---|---|---|---|---|
| 2011/0241188 A1* | 10/2011 | Mizuno | ................. | H01L 21/565 523/400 |
| 2012/0135096 A1* | 5/2012 | Maeyama | ............. | B29C 31/008 425/161 |
| 2015/0093856 A1* | 4/2015 | Liu | ........................ | H01L 21/561 438/107 |

* cited by examiner

*Primary Examiner* — Jay C Chang
(74) *Attorney, Agent, or Firm* — FOLEY & LARDNER LLP

(57) ABSTRACT

A method and a system for manufacturing a semiconductor package structure are provided. The method includes: (a) measuring an amount of a molding powder; (b) controlling the amount of a molding powder; and (c) dispensing the molding powder on an assembly structure including a carrier and at least one semiconductor device disposed on the carrier.

19 Claims, 21 Drawing Sheets

SYSTEM AND METHOD FOR MANUFACTURING A SEMICONDUCTOR PACKAGE STRUCTURE

BACKGROUND

1. Field of the Disclosure

The present disclosure relates to a system and a method for manufacturing a semiconductor package structure, and to a system used in a compression molding, and a manufacturing method for utilizing the same.

2. Description of the Related Art

An important function of the molding process for a semiconductor package is to isolate the semiconductor die from the atmosphere to avoid corrosion or signal damage. Two types of the molding processes may be compression molding and transfer molding. The process of compression molding is to place or dispense a plastic molding compound in a powder form or a particle form on the semiconductor die to be molded before the compression molding. After the plastic molding powder is melted by heating to become a fluid molding compound or a gel molding compound, a mold chase is used to compress the fluid molding compound or the gel molding compound. Then, the molding compound is cured or solidified to form an encapsulant to cover the semiconductor die. A critical issue of the compression molding process is the uniform distribution of the powder molding compound after the dispensing step.

SUMMARY

In some embodiments, a method for manufacturing a semiconductor package structure includes: (a) measuring an amount of a molding powder; (b) controlling the amount of a molding powder; and (c) dispensing the molding powder on an assembly structure including a carrier and at least one semiconductor device disposed on the carrier.

In some embodiments, a system for manufacturing a semiconductor package structure includes an measurement unit and a dispensing unit. The measurement unit is used for measuring an amount of a molding powder. The dispensing unit is used for dispensing the molding powder on an assembly structure including a carrier and at least one semiconductor device disposed on the carrier.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
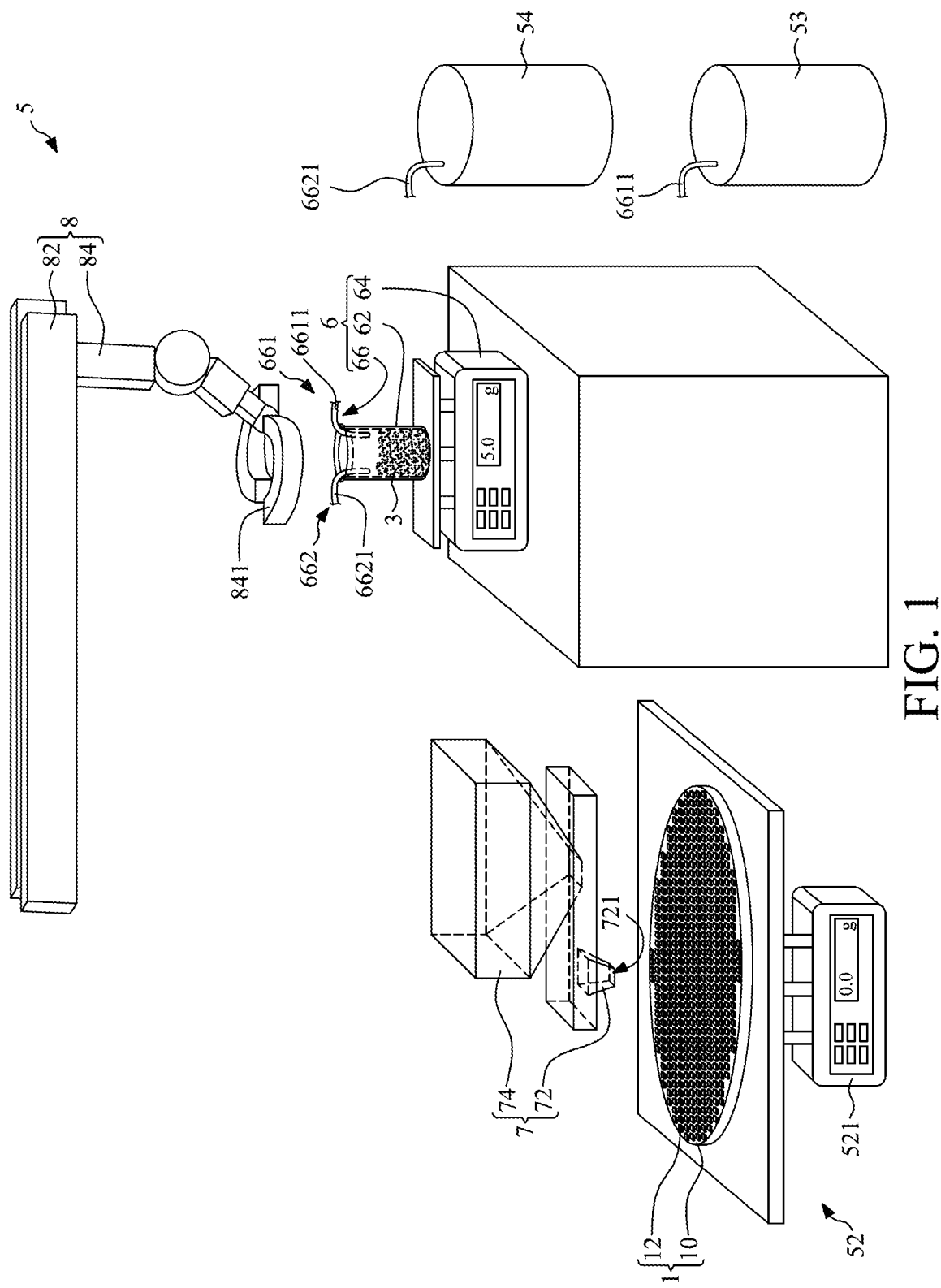
FIG. 1 illustrates a schematic arrangement of a system for manufacturing a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a schematic arrangement of a system 5 for manufacturing a semiconductor package structure according to some embodiments of the present disclosure. The system 5 may include a control unit 6, a dispensing unit 7, a delivery apparatus 8, a supporting device 52, a supply tank 53 and a recycle tank 54. The supporting device 52 may be used for supporting or receiving a workpiece (e.g., an assembly structure 1). The supply tank 53 may contain a large amount of molding powder 3, and may supply the molding powder 3 to the control unit 6. The control unit 6 is used for controlling an amount of the molding powder 3 from the supply tank 53. If the amount of the molding powder 3 measured by the measurement unit 64 is under a predetermined calculated amount (or a predetermined amount), the amount of the molding powder 3 in the control unit 6 may be increased from the supply tank 53 to reach the predetermined calculated amount. If the amount of the molding powder 3 measured by the measurement unit 64 exceeds the predetermined calculated amount, the excessive molding powder 3 may be removed from the control unit 6 and sent to the recycle tank 54. That is, the amount of the molding powder 3 in the control unit 6 is controlled according to the amount of the molding powder 3 measured by the measurement unit 64 and the predetermined amount. The amount of the molding powder 3 in the control unit 6 is increased and/or decreased according to the amount of the molding powder 3 measured by the measurement unit 64 and the predetermined amount.

The delivery apparatus 8 may be disposed above the control unit 6 and the dispensing unit 7, and may be used for delivering the molding powder 3 from the control unit 6 or the measurement unit 64 to the dispensing unit 7. The dispensing unit 7 may be used for dispensing the molding powder 3 on the workpiece (e.g., the assembly structure 1) that is disposed on the supporting device 52. The control unit 6 may be disposed adjacent to the dispensing unit 7. In some embodiments, the control unit 6 and the dispensing unit 7 may be two separated units. Alternatively, the control unit 6 may be assembled into the dispensing unit 7.

As shown in FIG. 1, the control unit 6 may include a container 62, a measurement unit 64 and an adjustment unit 66. The container 62 may be a cup, and may be used for accommodating the portion of the molding powder 3 from the supply tank 53, and may be placed or disposed on the measurement unit 64. The measurement unit 64 may be an electronic weight scale, and may be used for measuring a weight of the molding powder 3 in the container 62. In some embodiments, the measurement unit 64 may be used for measuring a volume of the molding powder 3 in the container 62. That is, the amount of the molding powder 3 may be referred to as a weight of the molding powder 3 or a volume of the molding powder 3. In some embodiments, the measurement unit 64 is not included in the control unit 6. That is, the system 5 may include the measurement unit 64, the control unit 6, the dispensing unit 7, the delivery apparatus 8, the supporting device 52, the supply tank 53 and the recycle tank 54. The control unit 6 may only include the container 62 and the adjustment unit 66.

In addition, the adjustment unit 66 may be used for adjusting the amount of the molding powder 3 in the container 62 according to the measurement result of the measurement unit 64. In some embodiments, the adjustment unit 66 may include an input apparatus 661 and an output apparatus 662. The input apparatus 661 may be used for adding the molding powder 3 into the container 62. For example, the input apparatus 661 may include an input suction pressure provider and an input channel 6611. The input channel 6611 may communicate the supply tank 53 and the container 62. Thus, the molding powder 3 may be supplied to the container 62 from the supply tank 53 through the input channel 6611 under the control of the input suction pressure provider. The input channel 6611 may be an input pipe.

Further, the output apparatus 662 may be used for removing a portion of the molding powder 3 from the container 62. The output apparatus 662 may include an output suction pressure provider and an output channel 6621. The output channel 6621 may communicate the recycle tank 54 and the container 62. Thus, the molding powder 3 may be removed from the container 62 to the recycle tank 54 through the output channel 6621 under the control of the output suction pressure provider. The output channel 6621 may be an output pipe. In some embodiments, the input pipe and the output pipe may be two different pipes. That is, the input channel 6611 and the output channel 6621 are located in different pipes, and the input suction pressure provider and the output suction pressure provider are two different suction pressure providers. However, the input channel 6611 and the output channel 6621 may be located in a same pipe, and the input suction pressure provider and the output suction pressure provider may be a same suction pressure provider.

The delivery apparatus 8 may include a railway 82 and a robot arm 84. The railway 82 extends between a position above the control unit 6 and a position above the dispensing unit 7. The robot arm 84 is slidable on and along the railway 82, and includes a clamping head 841, a rotation mechanism and a vibration mechanism. The clamping head 841 is used for clamping the container 62 of the control unit 6. After the clamping head 841 clamps the container 62, the robot arm 84 may move the container 62 upward or downward. The rotation mechanism is connected to the clamping head 841, and is used for rotating the clamping head 841 and the container 62 to pour the molding powder 3 in the container 62 into the dispensing unit 7. The vibration mechanism is connected to the clamping head 841, and is used for vibrating the clamping head 841 and the container 62 so that almost no residual molding powder remains in the container 62. That is, all of the molding powder 3 in the container 62 is poured into the dispensing unit 7.

The dispensing unit 7 may be disposed above the workpiece (e.g., the assembly structure 1) and the supporting device 52. The dispensing unit 7 may include a dispense head 72, a case 74 and a moving apparatus. The case 74 is connected to the dispense head 72, and is used for receiving the molding powder 3 from the container 62 of the control unit 6 and supplying the molding powder 3 to the dispense head 72. That is, the molding powder 3 in the container 62 is poured into the case 74 of the dispensing unit 7 by the rotation and the vibration of the clamping head 841. The dispense head 72 is disposed under the case 74, and is used for dispensing the molding powder 3 on the workpiece (e.g., the assembly structure 1). As shown in FIG. 1, the dispense head 72 may define a wide opening 721, and the wide opening 721 may be in a rectangular shape from a bottom view. Thus, the molding powder 3 falling from the wide opening 721 may be substantially in a strip shape.

In some embodiments, a vibration mechanism may be further included to be connected to the case 74. The vibration mechanism is used for vibrating the case 74 and the dispense head 72 so that almost no residual molding powder remains in the case 74 and the dispense head 72. That is, all of the molding powder 3 in the case 74 is dispensed on the workpiece (e.g., the assembly structure 1). In addition, the moving apparatus is connected to the case 74, and is used for moving the case 74 and the dispense head 72 along a specific predetermined path. Thus, the molding powder 3 is dispensed on the workpiece (e.g., the assembly structure 1) along the specific predetermined path, and the molding powder 3 on the workpiece (e.g., the assembly structure 1) may form a specific pattern.

The supporting device 52 may include a measurement unit (e.g., an electronic weight scale) 521 for measuring a weight of the workpiece (e.g., the assembly structure 1) and the molding powder 3 on the workpiece (e.g., the assembly structure 1) throughout the entire dispensing process. The position of the supporting device 52 may be fixed.

FIG. 2 through FIG. 19 illustrate a method for manufacturing a semiconductor package structure according to some embodiments of the present disclosure. In some embodiments, the method is for manufacturing the semiconductor package structure 4 shown in FIG. 19.

Figure 2:
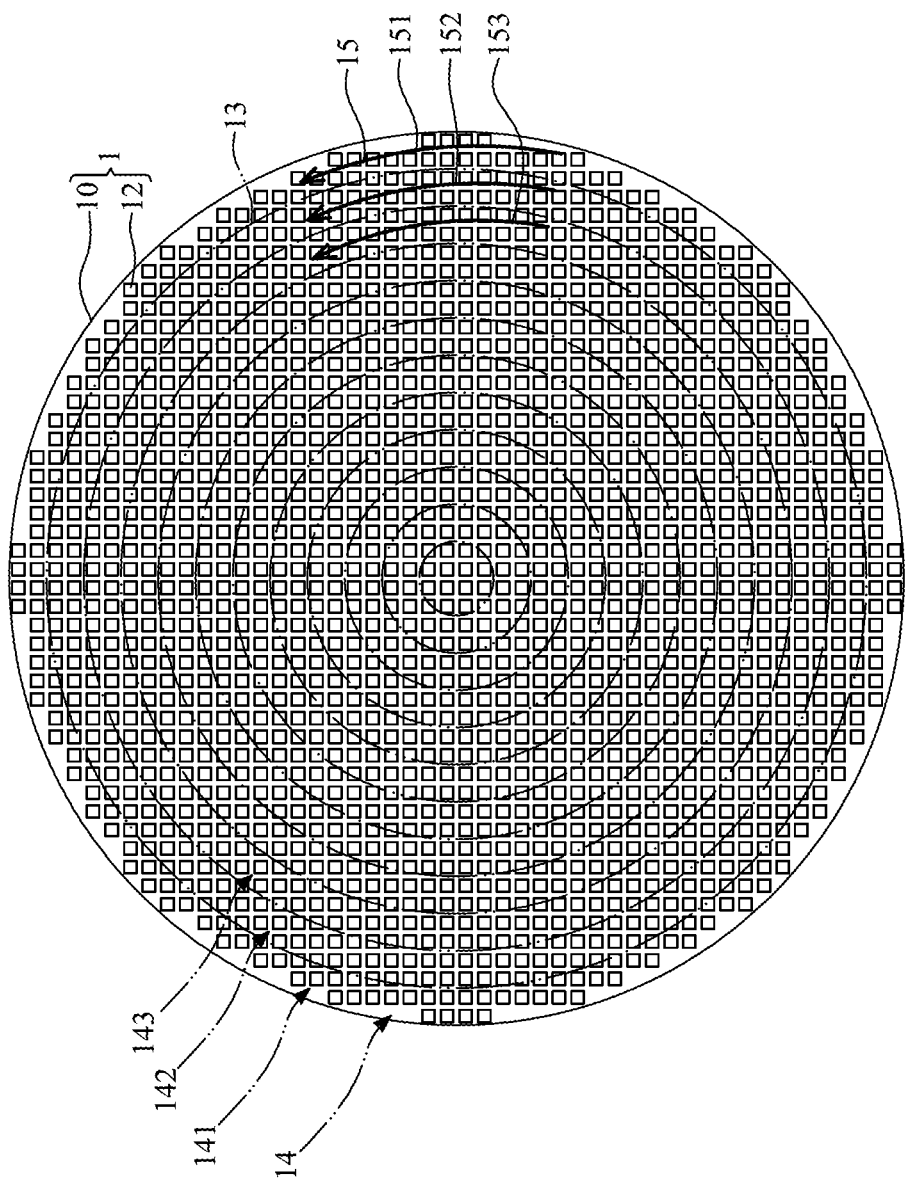
FIG. 2 illustrates one or more stages of an example of a method for manufacturing a semiconductor package structure according to some embodiments of the present disclosure.
Figure 3:
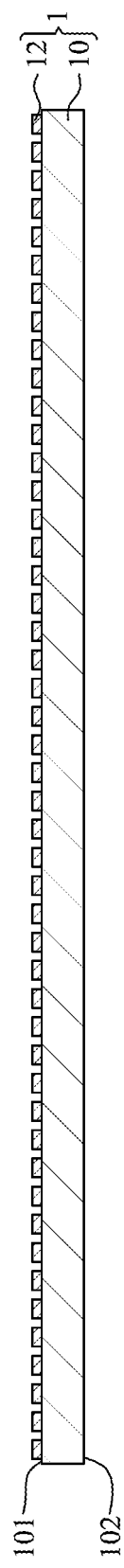
FIG. 3 illustrates one or more stages of an example of a method for manufacturing a semiconductor package structure according to some embodiments of the present disclosure.

Referring to FIG. 2 and FIG. 3, wherein FIG. 3 illustrates a cross-sectional view of an assembly structure 1 of FIG. 2, a workpiece (e.g., an assembly structure 1) is provided. The assembly structure 1 may include a carrier 10 and at least one semiconductor device 12 disposed on the carrier 10. The carrier 10 may have a first surface 101 (e.g., a top surface) and a second surface 102 (e.g., a bottom surface) opposite to the first surface 101. The carrier 10 may be a glass carrier, and may be in a wafer type, a panel type or a strip type. The at least one semiconductor device 12 may include a plurality of semiconductor dice or semiconductor chips disposed side by side on the first surface 101 of the carrier 10. In some embodiments, only known good dice are selected to be disposed on the carrier 10. A backside surface of the semiconductor device 12 may be attached to the carrier 10, and an active surface of the semiconductor device 12 may face upward. In some embodiments, the carrier 10 may be a semiconductor carrier, and the semiconductor device 12 (e.g., the semiconductor dice) may be attached to or electrically connected to the first surface 101 of the carrier 10 through flip-chip bonding. Thus, the active surface of the semiconductor device 12 may face the carrier 10, and the backside surface of the semiconductor device 12 may face upward.

The first surface 101 of the carrier 10 may include a plurality of regions 14 defined by a plurality of imaginary lines 13. The regions 14 may include a first region 141, a second region 142, a third region 143, and so on. For example, the first region 141 is the outermost region, the second region 142 is next to the first region 141, and the third region 143 is next to the second region 142. The first region 141 surrounds the second region 142, and the second region 142 surrounds the third region 143. The regions 14 (e.g., the first region 141, the second region 142 and the third region 143) are predetermined imaginary regions. As shown in FIG. 2, the imaginary lines 13 are concentric circles, thus, the regions 14 (e.g., the first region 141, the second region 142 and the third region 143) are in concentric circular shapes. If the imaginary lines 13 are concentric rectangles, the regions 14 (e.g., the first region 141, the second region 142 and the third region 143) are in concentric rectangular shapes. In addition, the widths of the regions 14 (e.g., the first region 141, the second region 142 and the third region 143) may be equal to each other. That is, the radius or diameter of the first surface 101 of the carrier 10 may be divided equally by the imaginary lines 13.

During the dispensing process, the dispense head 72 of the dispensing unit 7 may move along the regions 14 (e.g., the first region 141, the second region 142, the third region 143, and so on) in sequence. That is, the regions 14 (e.g., the first region 141, the second region 142 and the third region 143) are the places where the loop paths 15 of the dispense head 72 are disposed within. That is, the dispense head 72 of the dispensing unit 7 may move along a plurality of loop paths 15. For example, the loop paths 15 of the dispense head 72 may include a first loop path 151, a second loop path 152, a third loop path 153, and so on. The first loop path 151 is located within the first region 141, the second loop path 152 is located within the second region 142, and the third loop path is located within the third region 143. In some embodiments, each of the loop paths 15 is a single complete loop. The loop paths 15 may not connect one and another. For example, the first loop path 151 does not connect the second loop path 152. The first loop path 151 and the second loop path 152 are not continuous with each other. Further, the first loop path 151 is different from the second loop path 152. The first loop path 151 surrounds the second loop path 152, and the second loop path 152 surrounds the third loop path 153. In addition, the loop paths 15 (e.g., the first loop path 151, the second loop path 152 and the third loop path 153) are in concentric circular shapes or concentric rectangular shapes.

It is noted that the width of each of the regions 14 (e.g., the first region 141, the second region 142 and the third region 143) may be substantially greater or equal to a length of the wide opening 721 of the dispense head 72 of the dispensing unit 7. That is, the length of the wide opening 721 of the dispense head 72 may be less than or equal to a width of each of the loop paths 15. Thus, each of the regions 14 (e.g., the first region 141, the second region 142 and the third region 143) may be dispensed once.

Before the dispensing process, the amount of the molding powder 3 to be dispensed in each of the regions 14 (e.g., the first region 141, the second region 142, the third region 143, and so on) is calculated and predetermined based on the area of each of the regions 14 (e.g., the first region 141, the second region 142, the third region 143, and so on). Thus, after the dispensing process, the distribution density of the molding powder 3 in the regions 14 (e.g., the first region 141, the second region 142, the third region 143, and so on) may be substantially equal to each other. That is, the molding powder 3 on the entire workpiece (e.g., the assembly structure 1) may be substantially distributed evenly or uniformly.

In addition, the amount of the molding powder 3 to be dispensed in each of the regions 14 (e.g., the first region 141, the second region 142, the third region 143, and so on) may be further calculated and predetermined based on the distribution density of the at least one semiconductor device 12 on the carrier 10 or the distribution density of the at least one semiconductor device 12 on the regions 14 (or the loop paths 15). Thus, the amount of the molding powder 3 to be dispensed may be controlled according to the distribution density of the at least one semiconductor device 12 on the carrier 10 or the regions 14 (or the loop paths 15). The distribution density of the at least one semiconductor device 12 is defined as a quantity of the at least one semiconductor device 12 on an unit area (e.g., an area of each of the regions 14, or an unit area of each of the regions 14) of the carrier 10. Thus, after the dispensing process, there may be less amount of the molding powder 3 to be dispensed on the area or region with high distribution density of the at least one semiconductor device 12, and there may be more amount of the molding powder 3 to be dispensed on the area or region with low distribution density of the at least one semiconductor device 12.

As a result, the fluid or gel molding compound formed from the molten molding powder 3 during a heating process or a compression process may have a relatively small height difference. That is, the top surface of the fluid or gel molding compound may be substantially flat, and the entire top surface of the fluid or gel molding compound may contact the inner surface of a mold chase at a same time. Therefore, during a compression process, the fluid or gel molding compound will not flow horizontally or will flow horizontally a short distance, and will not push the semiconductor device 12 to shift from its original position.

Figure 4:
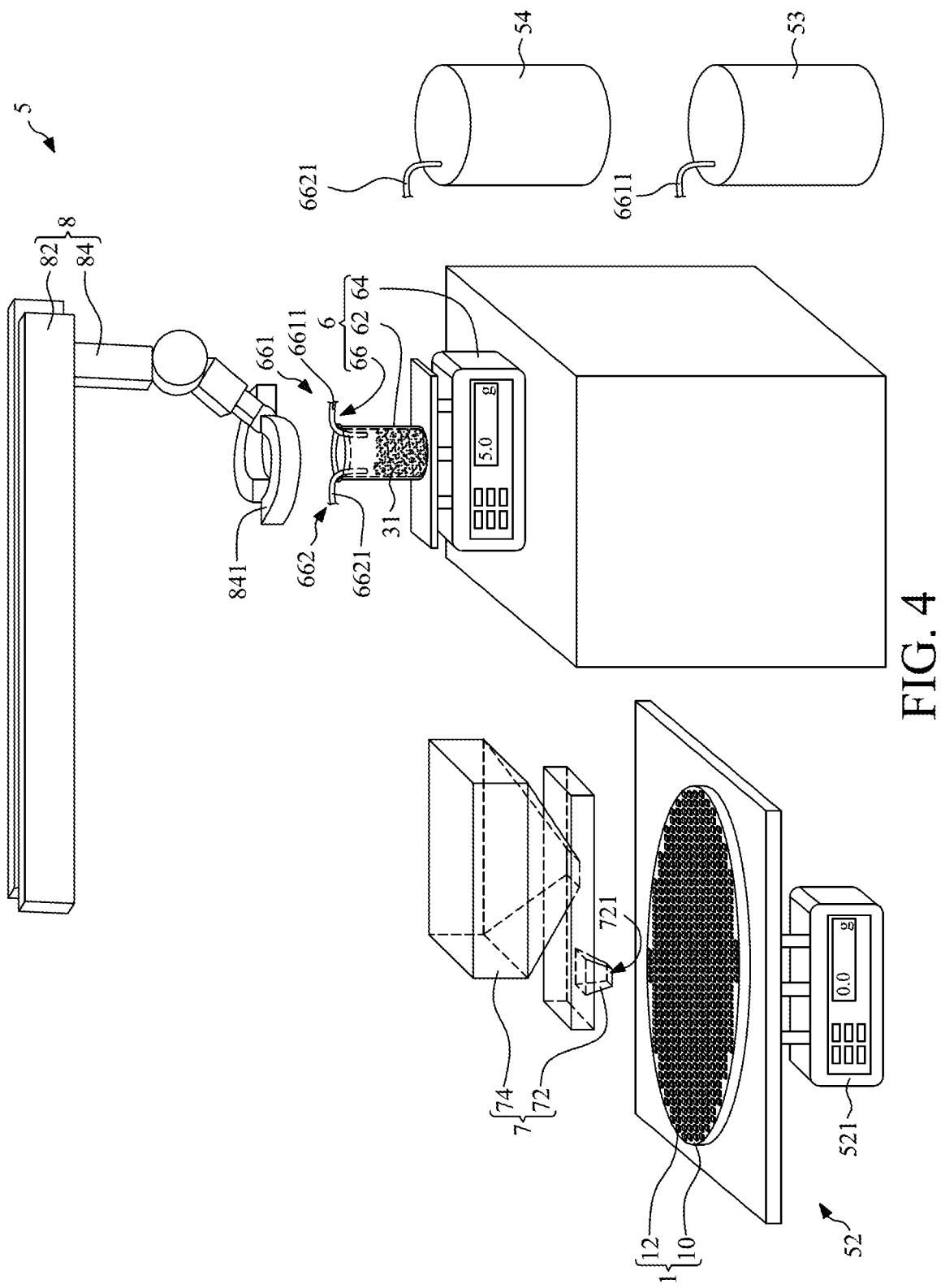
FIG. 4 illustrates one or more stages of an example of a method for manufacturing a semiconductor package structure according to some embodiments of the present disclosure.

Referring to FIG. 4, a first amount (e.g., a first weight) of a first molding powder 31 is controlled. The first molding powder 31 is used to be dispensed on the first region 141 along the first loop path 151. The first amount of the first molding powder 31 is calculated and predetermined previously. Then, the first molding powder 31 may be supplied to the container 62 from the supply tank 53 through the input channel 6611 under the control of the input suction pressure provider of the input apparatus 661. The container 62 is placed or disposed on the measurement unit 64 (e.g., an electronic weight scale), thus, the measurement unit 64 (e.g., an electronic weight scale) can measure and monitor the amount (e.g., the weight) of the first molding powder 31 in the container 62 continuously. Then, the amount (e.g., the weight) of the first molding powder 31 in the container 62 is adjusted as follows. Before the amount (e.g., the weight) of the first molding powder 31 in the container 62 reaches the predetermined calculated first amount (e.g., the first weight), the first molding powder 31 is supplied to the container 62 from the supply tank 53. That is, the amount of the first molding powder 31 in the container 62 is increased to reach the predetermined calculated amount by the input apparatus 661. If the amount (e.g., the weight) of the first molding powder 31 in the container 62 reaches the predetermined calculated first amount (e.g., the first weight), the input apparatus 661 stops to supply the first molding powder 31. If the amount (e.g., the weight) of the first molding powder 31 in the container 62 exceeds the predetermined calculated first amount (e.g., the first weight), the excessive first molding powder 31 that exceeds the predetermined calculated first amount is removed from the container 62 (e.g., the amount of the first molding powder 31 in the container 62 is decreased) and is sent to the recycle tank 54 through the output channel 6621 under the control of the output suction pressure provider of the output apparatus 662.

Figure 5:
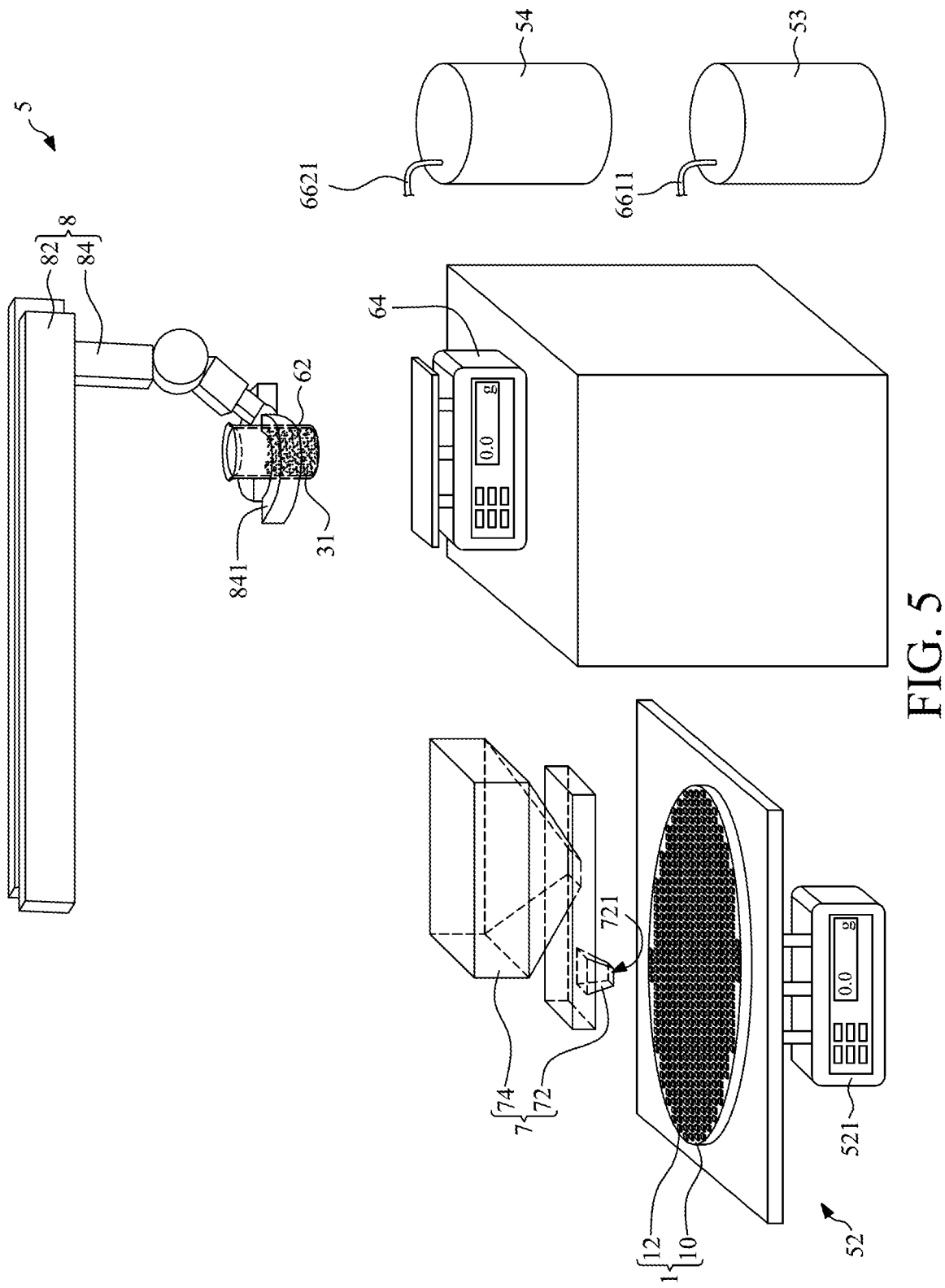
FIG. 5 illustrates one or more stages of an example of a method for manufacturing a semiconductor package structure according to some embodiments of the present disclosure.

Referring to FIG. 5, when the first amount (e.g., the first weight) of the first molding powder 31 in the container 62 is controlled to be equal to the predetermined first amount (e.g., first weight), the container 62 is clamped by the clamping head 841 of the delivery apparatus 8 and is then moved upward to leave the measurement unit 64 (e.g., an electronic weight scale).

Figure 6:
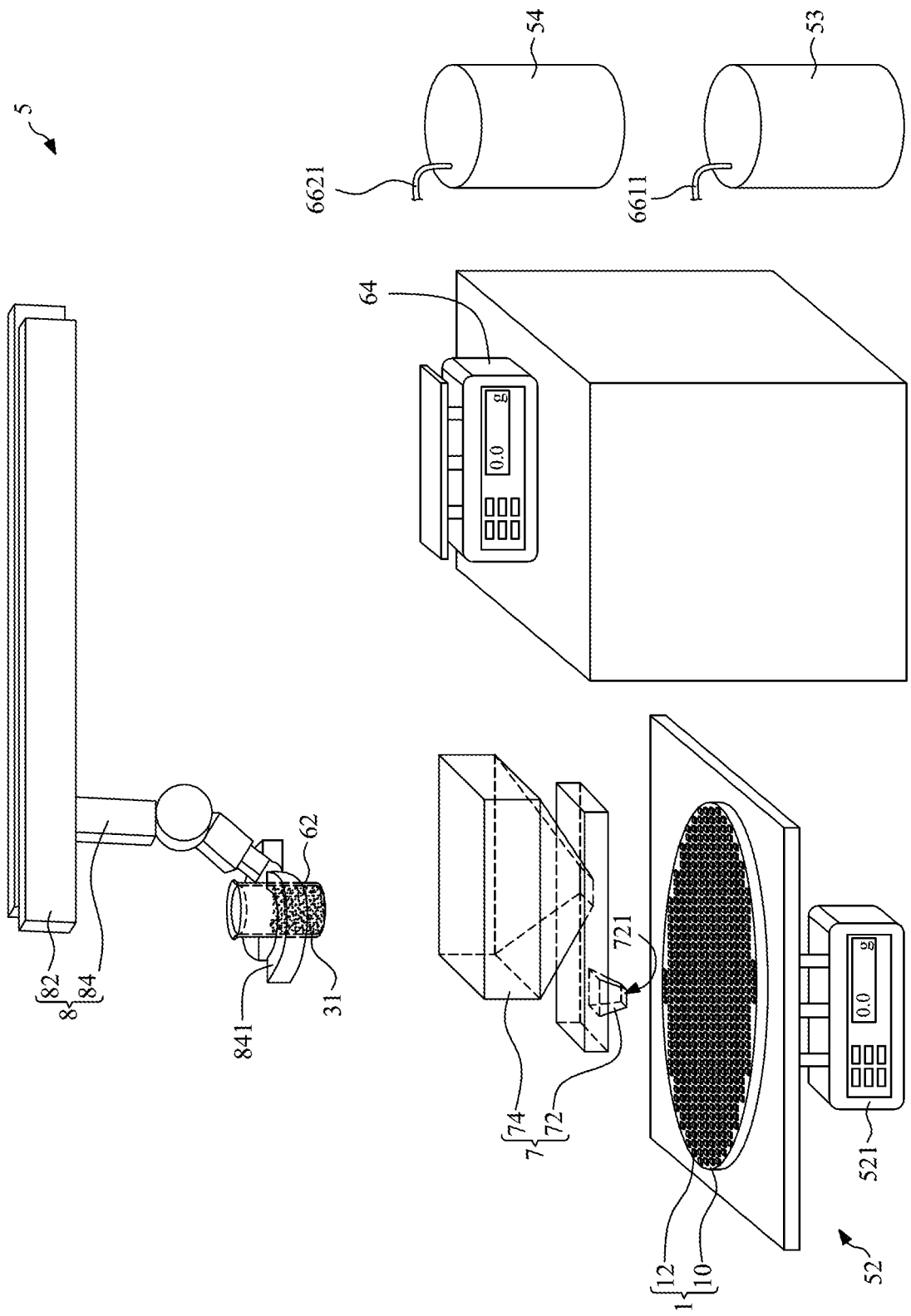
FIG. 6 illustrates one or more stages of an example of a method for manufacturing a semiconductor package structure according to some embodiments of the present disclosure.

Referring to FIG. 6, the robot arm 84 of the delivery apparatus 8 takes the container 62 to move to a position above the case 74 of the dispensing unit 7 along the railway 82.

Figure 7:
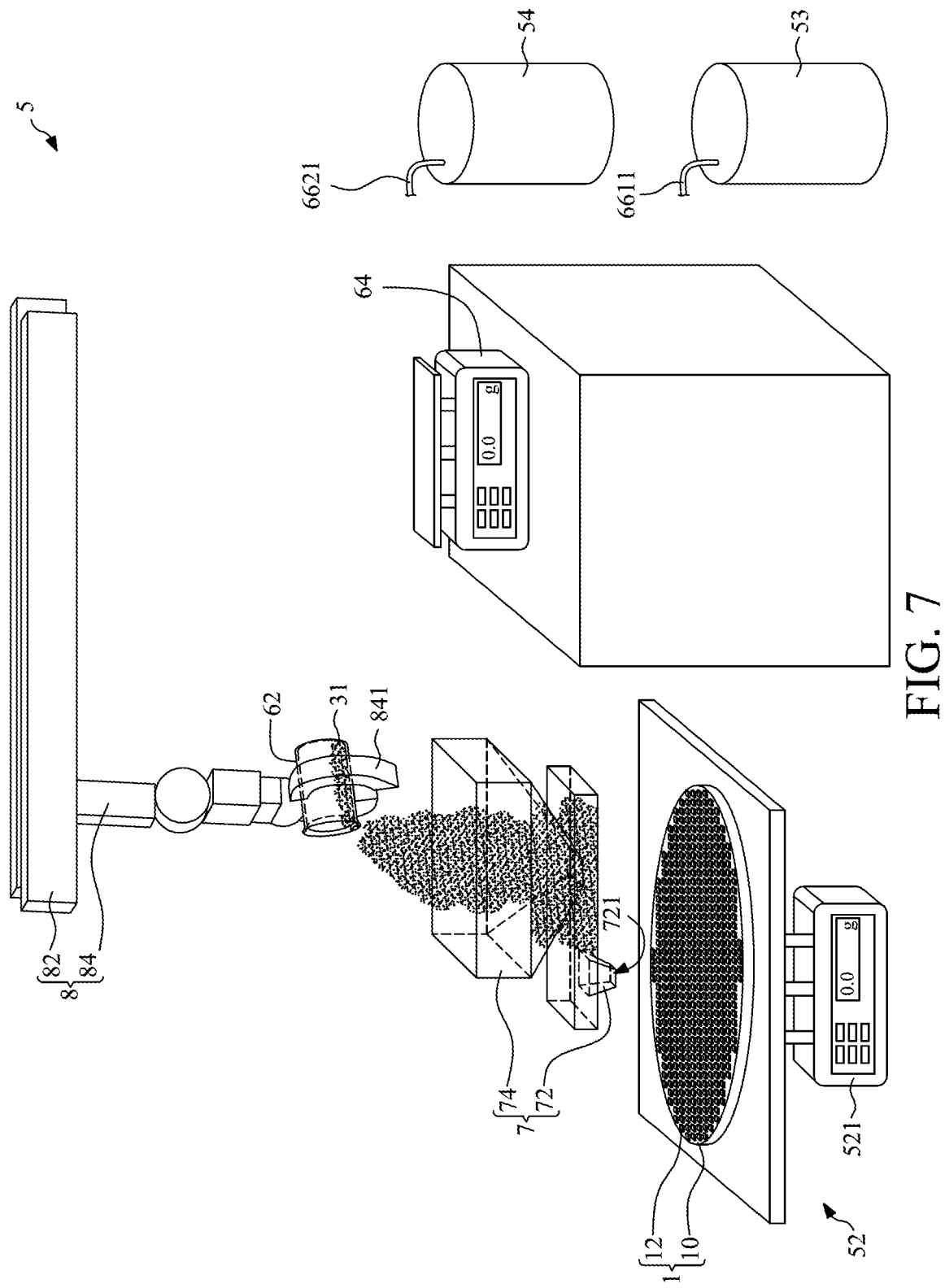
FIG. 7 illustrates one or more stages of an example of a method for manufacturing a semiconductor package structure according to some embodiments of the present disclosure.

Referring to FIG. 7, the rotation mechanism of the dispensing unit 7 rotate the clamping head 841 and the container 62 to pour the molding powder 3 in the container 62 into the case 74 of the dispensing unit 7.

Figure 8:
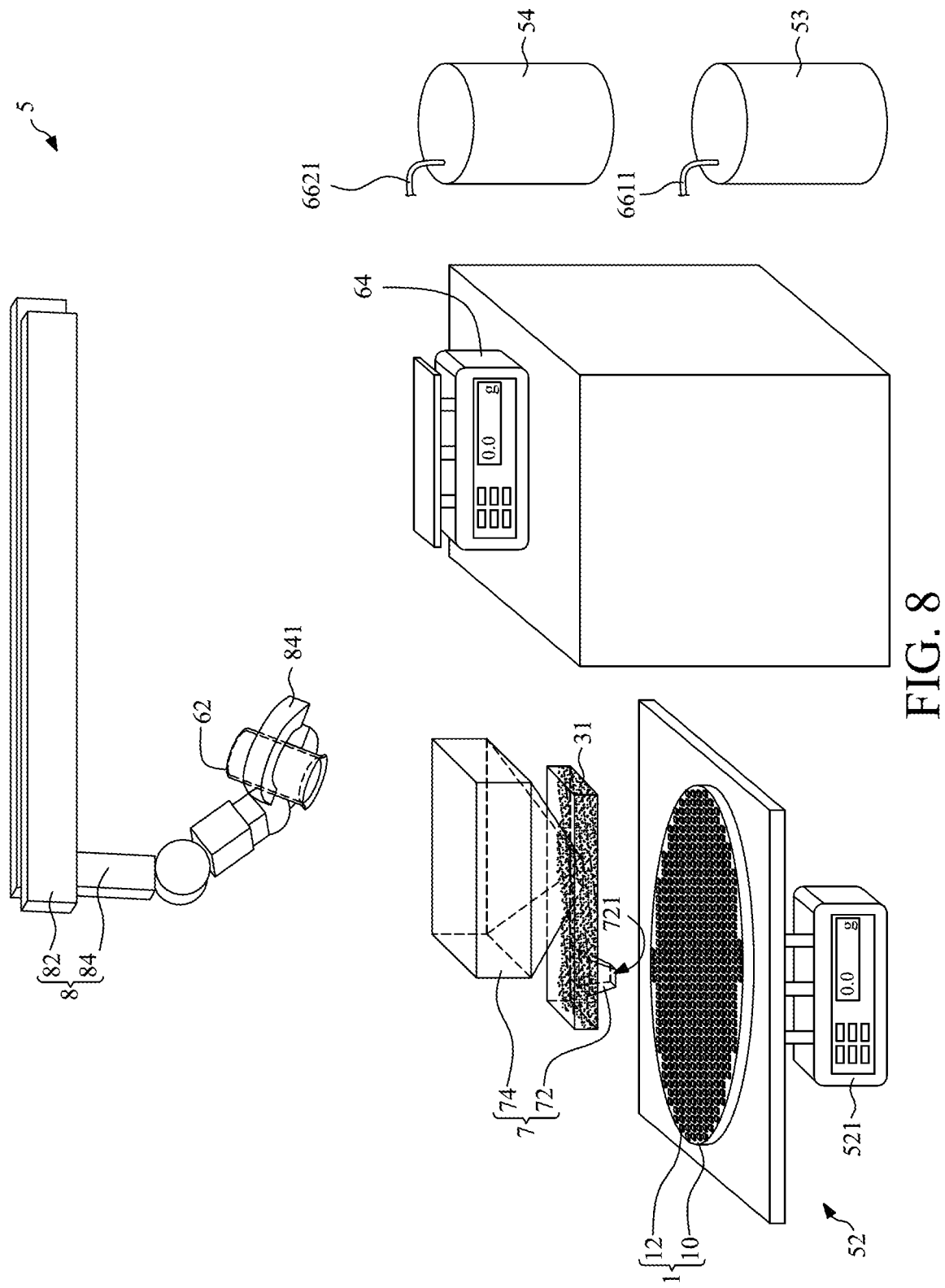
FIG. 8 illustrates one or more stages of an example of a method for manufacturing a semiconductor package structure according to some embodiments of the present disclosure.

Referring to FIG. 8, the rotation mechanism of the dispensing unit 7 may further rotate the clamping head 841 and the container 62 so that the opening of the container 62 may face the case 74 of the dispensing unit 7. Meanwhile, the vibration mechanism of the dispensing unit 7 may vibrates the clamping head 841 and the container 62 that accommodates the portion of the molding powder 3 so that almost no residual first molding powder 31 remains in the container 62. That is, all of the first molding powder 31 in the container 62 is poured into the case 74 of the dispensing unit 7.

Figure 9:
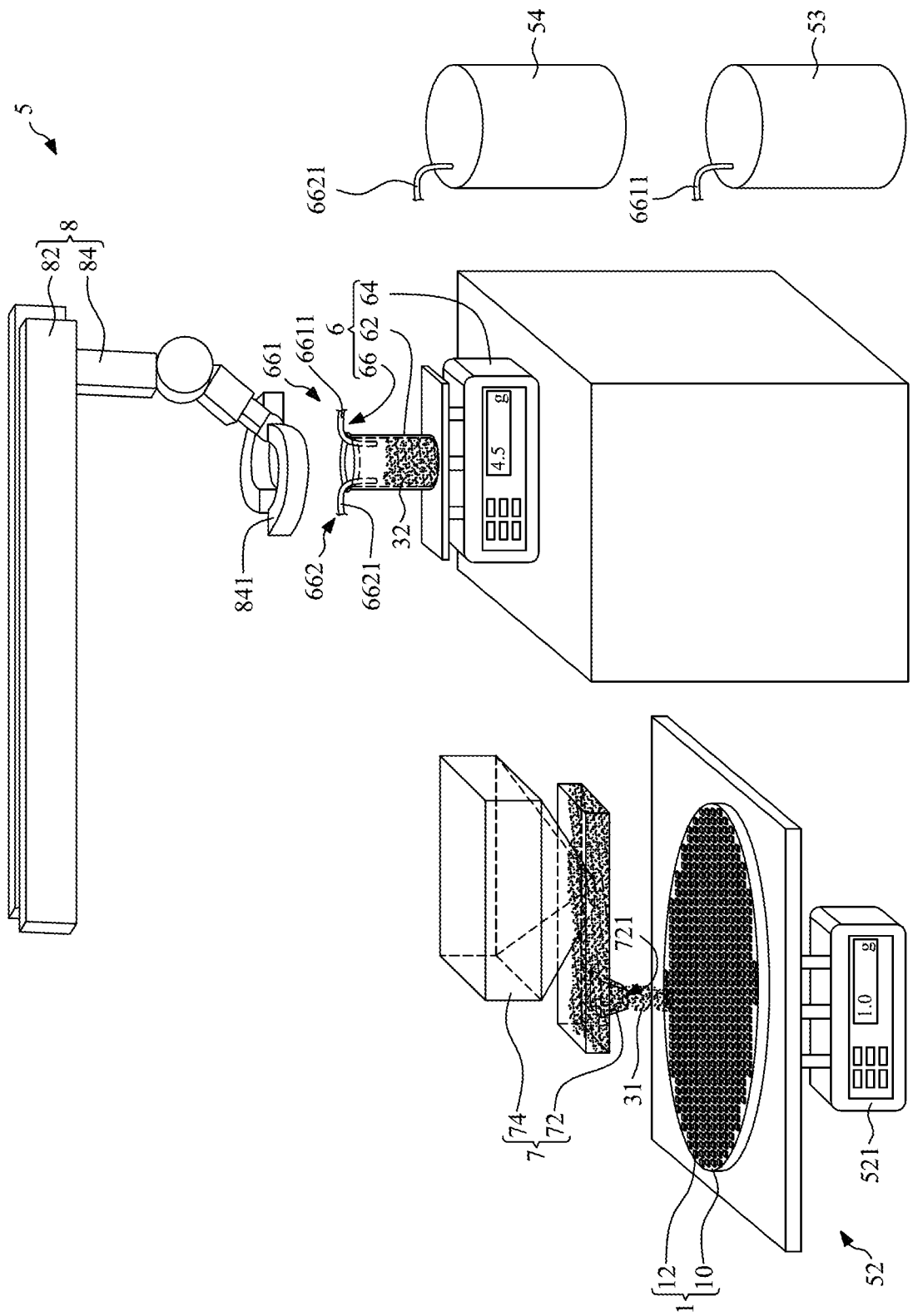
FIG. 9 illustrates one or more stages of an example of a method for manufacturing a semiconductor package structure according to some embodiments of the present disclosure.

Referring to FIG. 9, the dispense head 72 dispenses the first molding powder 31 on the assembly structure 1. Meanwhile, the moving apparatus of the dispensing unit 7 moves the case 74 and the dispense head 72 along the first loop path 151 in the first region 141 (FIG. 2). Thus, the first molding powder 31 is dispensed on the first region 141 (FIG. 2) of the workpiece (e.g., the assembly structure 1) along the first loop path 151. In some embodiments, the vibration mechanism of the dispensing unit 7 may vibrates the case 74 and the dispense head 72 of the dispensing unit 7 during the dispensing process so that almost no residual first molding powder remains in the case 74 and the dispense head 72. That is, all of the first molding powder 31 in the case 74 is dispensed on the workpiece (e.g., the assembly structure 1). As shown in FIG. 9, after the dispensing process, the first amount (e.g., the first weight) of the first molding powder 31 dispensed on the workpiece (e.g., the assembly structure 1) is measured by the electronic weight scale 521 of the supporting device 52.

In some embodiments, during the dispensing process, the robot arm 84 of the delivery apparatus 8 may take the container 62 back to the measurement unit 64 (e.g., an electronic weight scale) to proceed the controlling process of the second molding powder 32.

Figure 10:
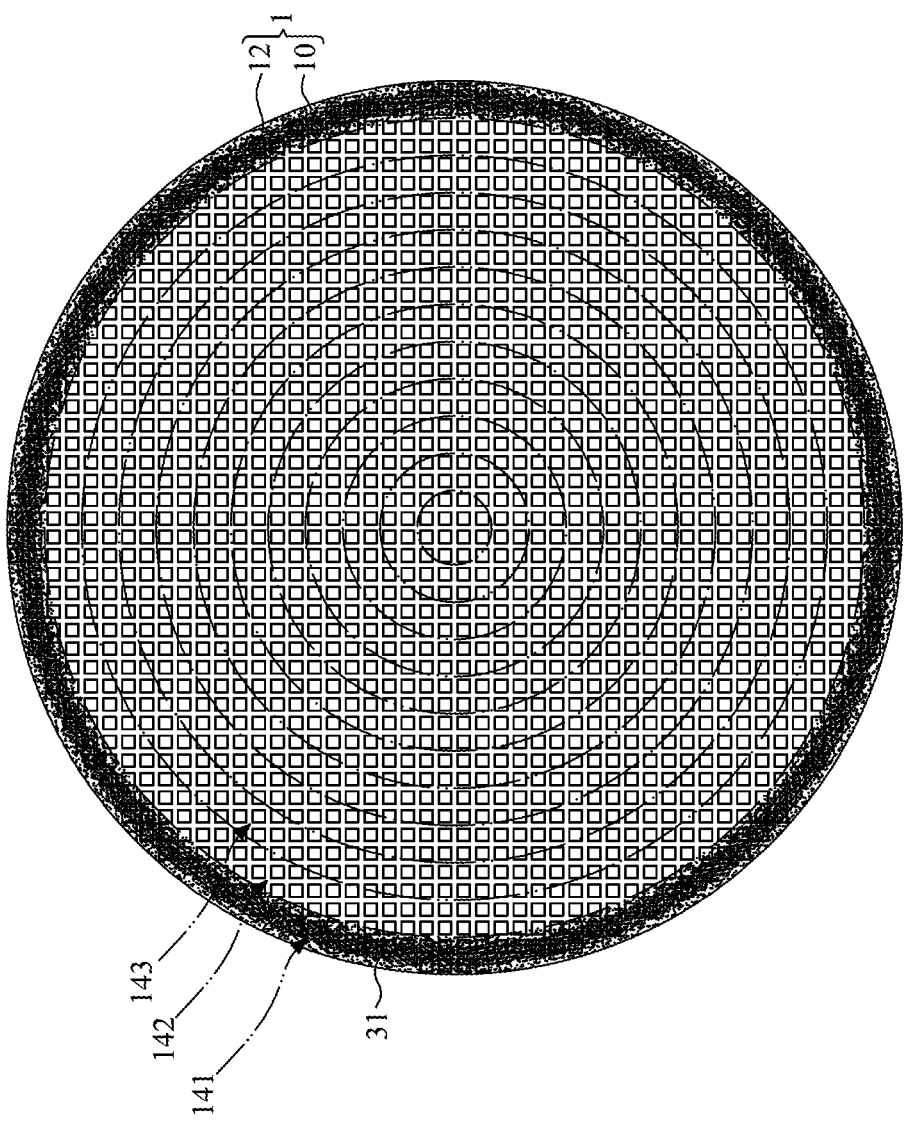
FIG. 10 illustrates one or more stages of an example of a method for manufacturing a semiconductor package structure according to some embodiments of the present disclosure.
Figure 11:
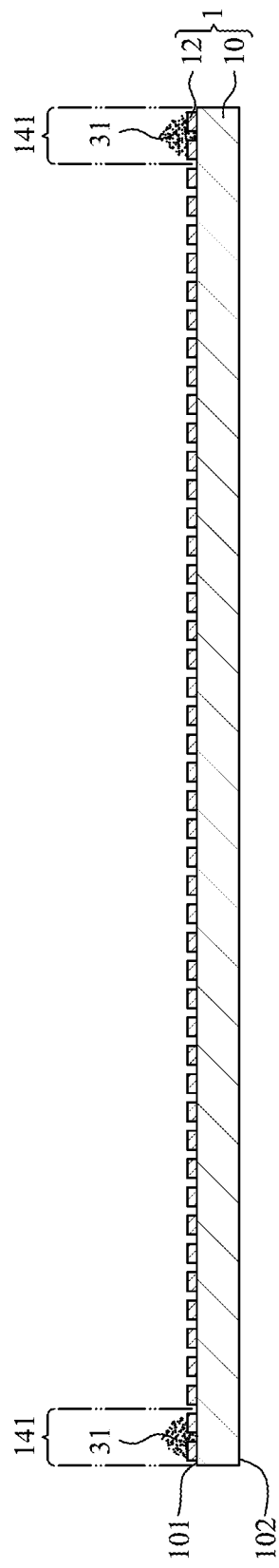
FIG. 11 illustrates one or more stages of an example of a method for manufacturing a semiconductor package structure according to some embodiments of the present disclosure.

Referring to FIG. 10 and FIG. 11, wherein FIG. 11 is a cross-sectional view of FIG. 10, the first molding powder 31 on the workpiece (e.g., the assembly structure 1) may form a specific pattern (e.g., a ring shape) in the first region 141 after the dispensing process of FIG. 9 is completed. As shown in FIG. 11, the dispensed first molding powder 31 may be a hill shape from the cross-sectional view.

Then, the stages of FIG. 2 through FIG. 9 are repeated one or more times. Referring back to FIG. 9, a second amount (e.g., a second weight) of a second molding powder 32 is controlled. The second molding powder 32 is used to be dispensed on the second region 142 along the second loop path 152 (FIG. 2). The second amount of the second molding powder 32 is calculated and predetermined previously. Then, the second molding powder 32 may be supplied to the container 62 from the supply tank 53 through the input channel 6611 under the control of the input suction pressure provider of the input apparatus 661. The container 62 is placed or disposed on the measurement unit 64 (e.g., an electronic weight scale), thus, the measurement unit 64 (e.g., an electronic weight scale) can measure and monitor the amount (e.g., the weight) of the second molding powder 32 in the container 62 continuously. Then, the amount (e.g., the weight) of the second molding powder 32 in the container 62 is adjusted as follows. Before the amount (e.g., the weight) of the second molding powder 32 in the container 62 reaches the predetermined second amount (e.g., the second weight), the second molding powder 32 is supplied to the container 62 from the supply tank 53. If the amount (e.g., the weight) of the second molding powder 32 in the container 62 reaches the predetermined second amount (e.g., the second weight), the input apparatus 661 stops to supply the second molding powder 32. If the amount (e.g., the weight) of the second molding powder 32 in the container 62 exceeds the predetermined second amount (e.g., the second weight), the excessive second molding powder 32 is removed from the container 62 and is sent to the recycle tank 54 through the output channel 6621 under the control of the output suction pressure provider of the output apparatus 662.

It is noted that the second molding powder 32 and the first molding powder 31 may come from a same supply tank 53. Thus, the second molding powder 32 and the first molding powder 31 may be the same material. In addition, the second amount (e.g., the second weight) of the second molding powder 32 may be different from the first amount (e.g., the first weight) of the first molding powder 31. For example, the second amount (e.g., the second weight) of the second molding powder 32 may be less than the first amount (e.g., the first weight) of the first molding powder 31.

In some embodiments, the first amount (e.g., the first weight) of the first molding powder 31 dispensed on the workpiece (e.g., the assembly structure 1) measured by the electronic weight scale 521 of the supporting device 52 in FIG. 9 after the dispensing process may be not equal to the first amount (e.g., the first weight) of the first molding powder 31 measured by the measurement unit 64 (e.g., an electronic weight scale) in FIG. 4. That is, not all of the first molding powder 31 in the container 62 is dispensed on the workpiece (e.g., the assembly structure 1). There may be some first molding powder 31 that remains in the container 62, in the case 74, or in the dispense head 72. Thus, after comparison, an amount difference between the first amount (e.g., the first weight) of the first molding powder 31 dispensed on the workpiece (e.g., the assembly structure 1) measured by the electronic weight scale 521 in FIG. 9 and the first amount (e.g., the first weight) of the first molding powder 31 measured by the measurement unit 64 (e.g., an electronic weight scale) in FIG. 4 is determined. Then, in order to compensate such amount difference, the second amount of the second molding powder 32 in FIG. 9 is modified according to the amount difference. In some embodiments, the amount difference is added into the predetermined calculated second amount of the second molding powder 32. Thus, the second amount of the second molding powder 32 in FIG. 9 is a sum of the amount difference and the predetermined calculated second amount of the second molding powder 32. That is, the second amount of the second molding powder 32 in FIG. 9 is corrected according to amount difference between the first amount of the first molding powder 31 on the assembly structure 1 in FIG. 9 and the first amount of the first molding powder 31 in FIG. 4.

Figure 12:
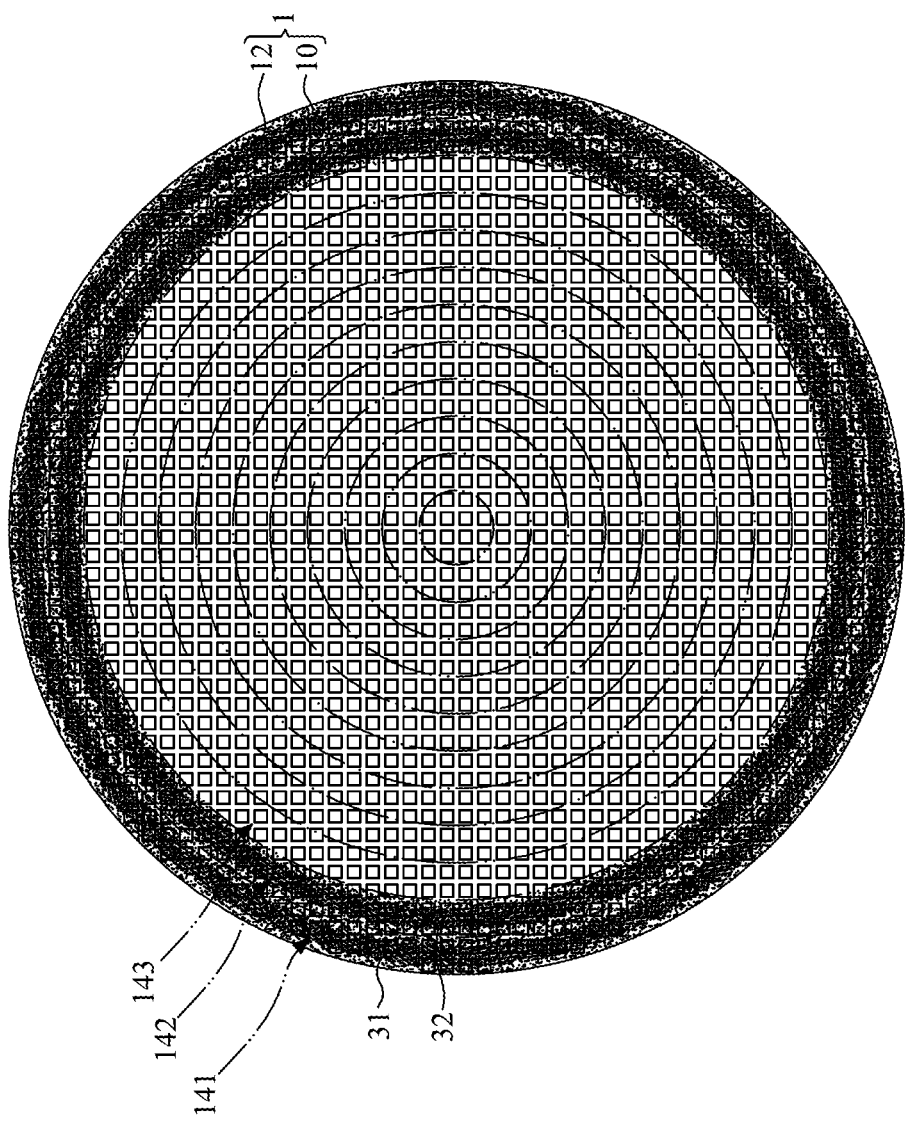
FIG. 12 illustrates one or more stages of an example of a method for manufacturing a semiconductor package structure according to some embodiments of the present disclosure.
Figure 13:
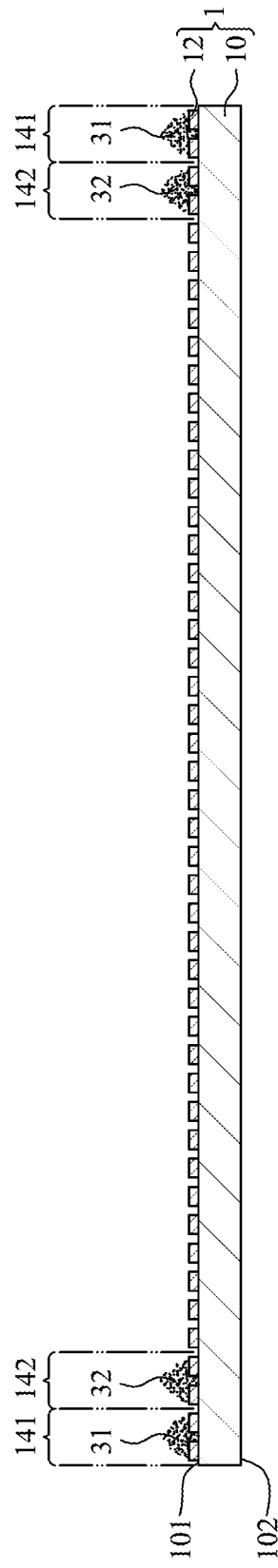
FIG. 13 illustrates one or more stages of an example of a method for manufacturing a semiconductor package structure according to some embodiments of the present disclosure.

Referring to FIG. 12 and FIG. 13, wherein FIG. 13 is a cross-sectional view of FIG. 12, the second molding powder 32 on the workpiece (e.g., the assembly structure 1) may form a specific pattern (e.g., a ring shape) in the second region 142 after the dispensing process of FIG. 9 is completed. As shown in FIG. 13, the dispensed second molding powder 32 may be a hill shape from the cross-sectional view.

Then, the stages of FIG. 2 through FIG. 9 are repeated. A third amount (e.g., a third weight) of a third molding powder 33 (FIG. 15 and FIG. 16) is controlled. The third molding powder 33 is used to be dispensed on the third region 143 along the third loop path 153 (FIG. 2). The third amount of the third molding powder 33 is calculated and predetermined previously. It is noted that if an amount difference of the second molding powder 32 occurs, the third amount of the third molding powder 33 is modified according to such amount difference.

Figure 14:
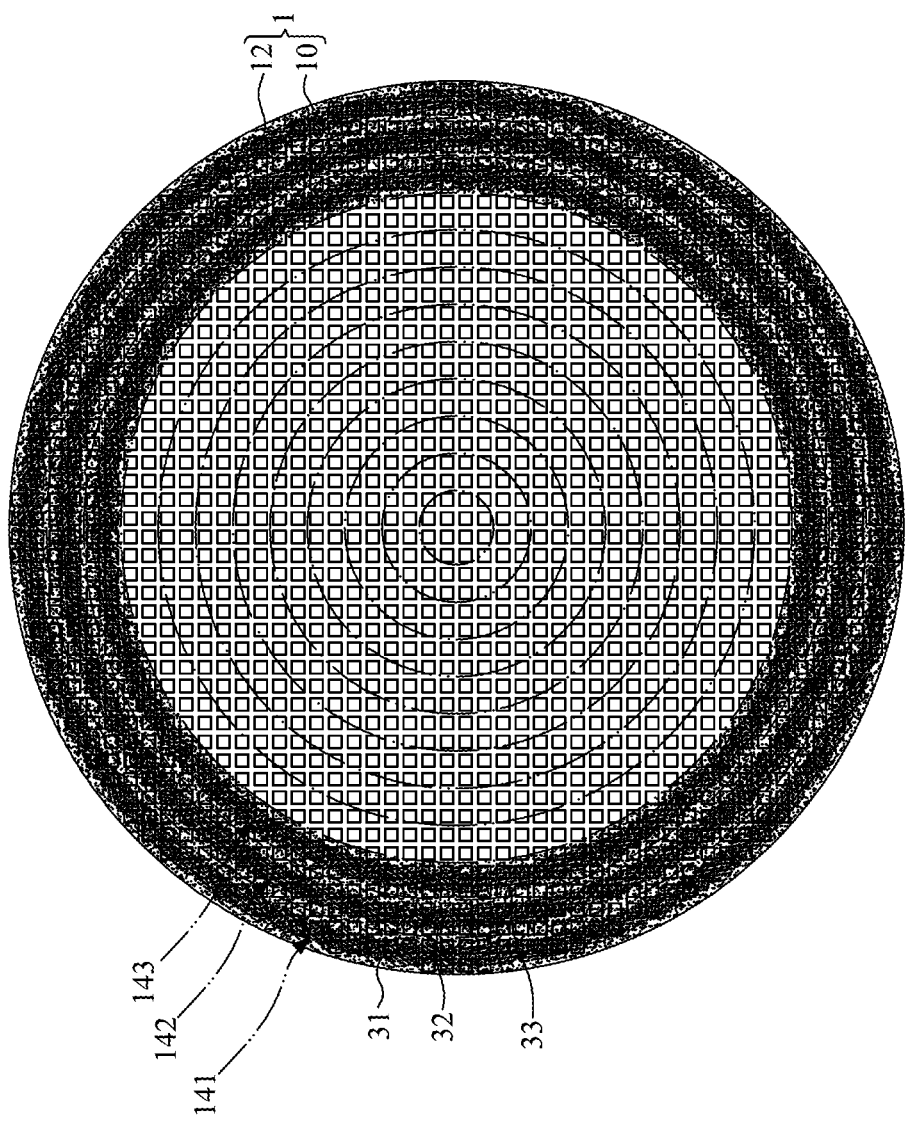
FIG. 14 illustrates one or more stages of an example of a method for manufacturing a semiconductor package structure according to some embodiments of the present disclosure.
Figure 15:
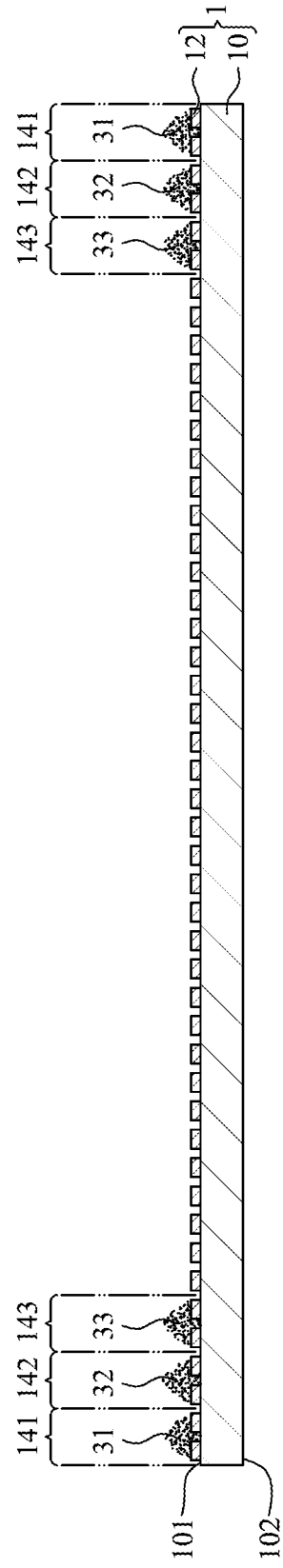
FIG. 15 illustrates one or more stages of an example of a method for manufacturing a semiconductor package structure according to some embodiments of the present disclosure.

Referring to FIG. 14 and FIG. 15, wherein FIG. 15 is a cross-sectional view of FIG. 14, the second molding powder 33 on the workpiece (e.g., the assembly structure 1) may form a specific pattern (e.g., a ring shape) in the third region 143 after the dispensing process is completed. As shown in FIG. 15, the dispensed third molding powder 33 may be a hill shape from the cross-sectional view.

Figure 16:
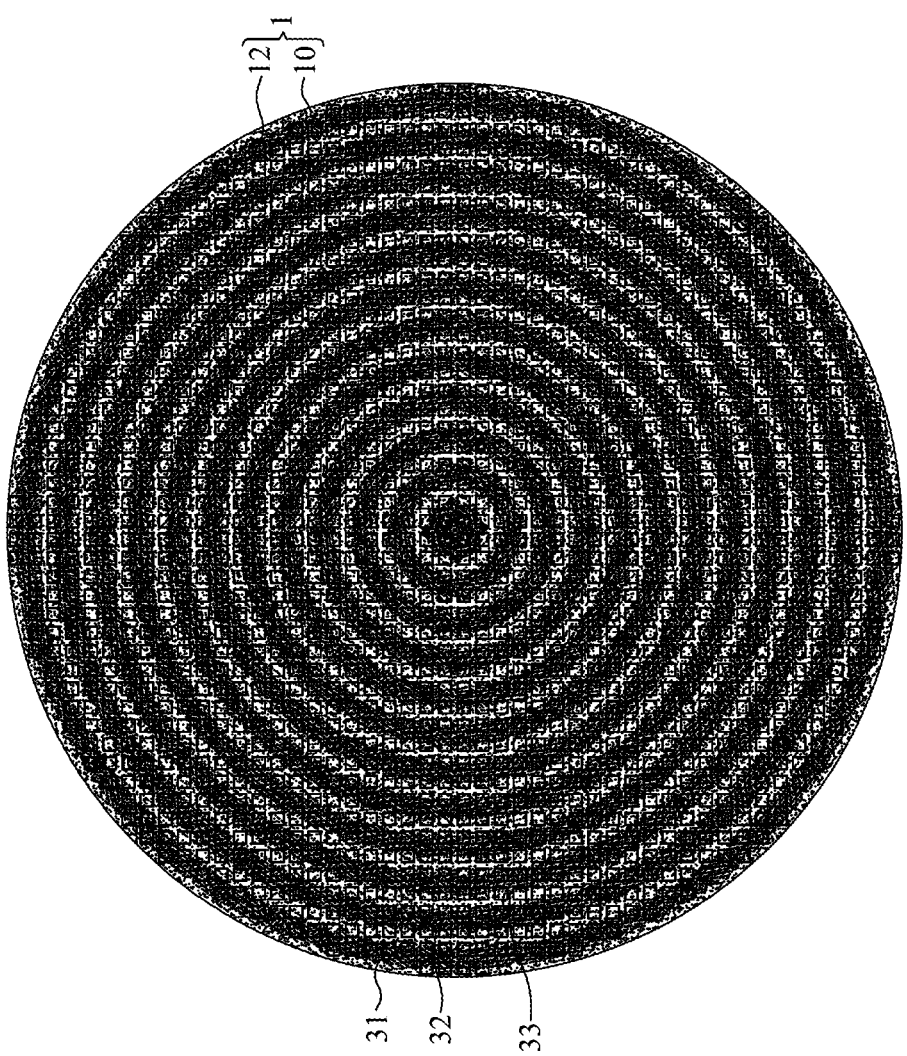
FIG. 16 illustrates one or more stages of an example of a method for manufacturing a semiconductor package structure according to some embodiments of the present disclosure.
Figure 17:
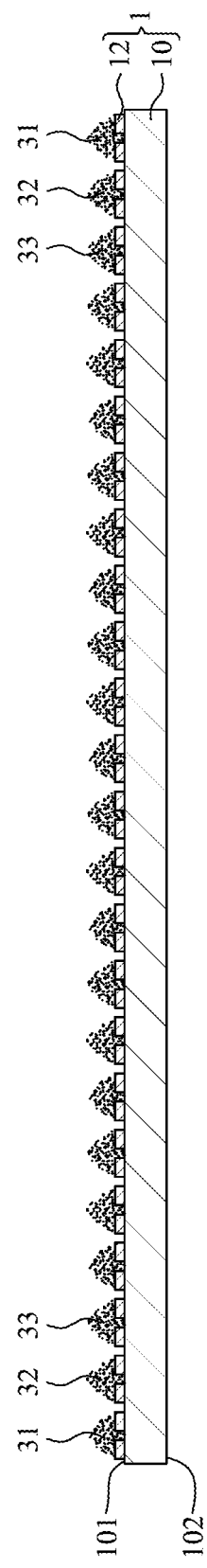
FIG. 17 illustrates one or more stages of an example of a method for manufacturing a semiconductor package structure according to some embodiments of the present disclosure.

Then, the stages of FIG. 2 through FIG. 9 are repeated again and again. Referring to FIG. 16 and FIG. 17, wherein FIG. 17 is a cross-sectional view of FIG. 16, the molding powder on the workpiece (e.g., the assembly structure 1) may form a plurality of specific patterns (e.g., ring shapes) in the regions 14 after the entire dispensing process is completed. As shown in FIG. 17, the dispensed molding powder may be a plurality of hill shapes from the cross-sectional view. As shown in FIG. 16 and FIG. 17, the molding powder is distributed evenly and uniformly on the workpiece (e.g., the assembly structure 1).

The molding powder 3 is dispensed from a periphery of the assembly structure 1 to a center of the assembly structure 1. For example, the molding powder 3 is dispensed from the outermost loop path (i.e., the first loop path 151) to the innermost loop path.

Figure 18:
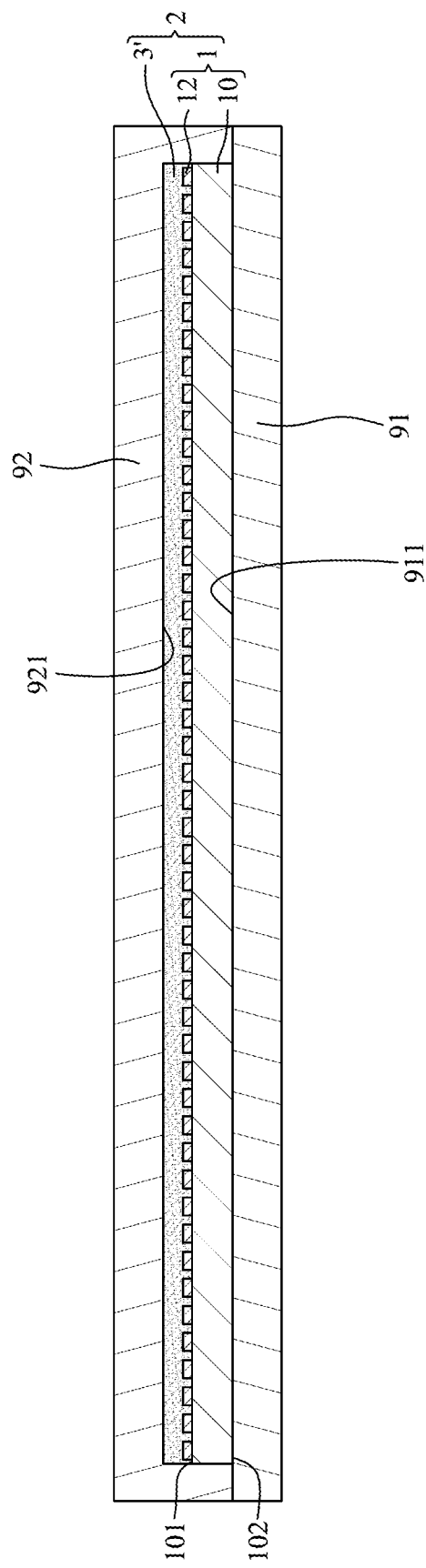
FIG. 18 illustrates one or more stages of an example of a method for manufacturing a semiconductor package structure according to some embodiments of the present disclosure.

Referring to FIG. 18, the molding powder is heated and melted to become a molding compound in a fluid state or gel state. Since the molding powder is distributed evenly and uniformly on the workpiece (e.g., the assembly structure 1), the entire molding compound may have a relatively small height difference. That is, the top surface of the fluid or gel molding compound may be substantially flat. Then, a lower mold chase 91 and an upper mold chase 92 are applied to the workpiece (e.g., the assembly structure 1) and the molding compound. The inner surface 921 of the upper mold chase 92 and the inner surface 911 of the lower mold chase 91 define a mold cavity for accommodating the workpiece (e.g., the assembly structure 1) and the molding compound. The upper mold chase 92 may move downward to compress the molding compound. As shown in FIG. 18, the entire top surface of the fluid or gel molding compound may contact the inner surface 921 of the upper mold chase 92 at a same time. Therefore, during the compression process, the fluid or gel molding compound will not flow horizontally or will flow horizontally a short distance, and will not push the semiconductor device 12 to shift from its original position. Then, the molding compound is cured and solidified to become an encapsulant 3' that covers the workpiece (e.g., the assembly structure 1) including the carrier 10 and the semiconductor device 12.

Figure 19:
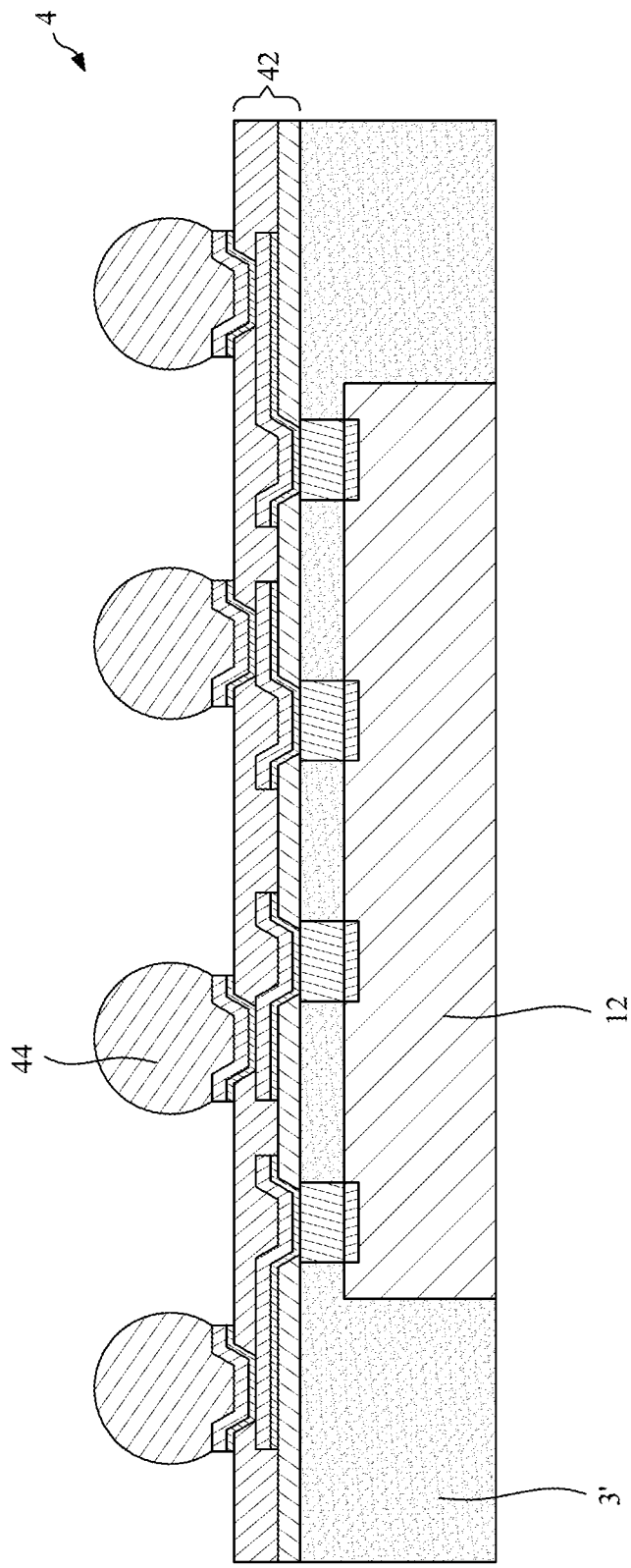
FIG. 19 illustrates one or more stages of an example of a method for manufacturing a semiconductor package structure according to some embodiments of the present disclosure.

Referring to FIG. 19, the lower mold chase 91 and the upper mold chase 92 are removed. Then, a redistribution structure 42 is formed on a top surface of the encapsulant 3'. Then, a plurality of external connectors 44 are formed on the redistribution structure 42, so as to be electrically connected to the semiconductor device 12. Then, the carrier 10 may be removed. Then, a singulation process is conducted so as to form a plurality of semiconductor package structures 4.

Figure 20:
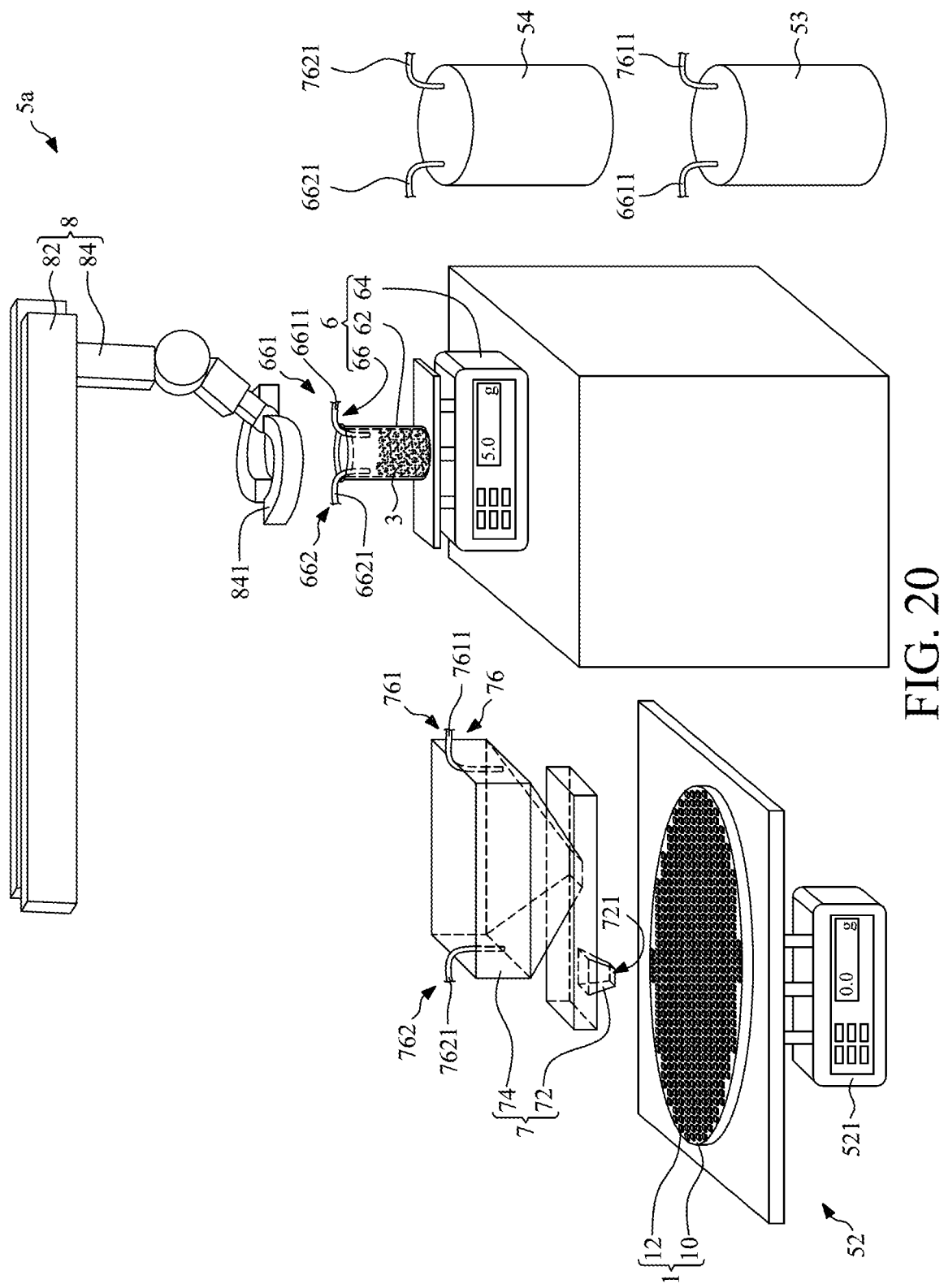
FIG. 20 illustrates a schematic arrangement of a system for manufacturing a semiconductor package structure according to some embodiments of the present disclosure.

FIG. 20 illustrates a schematic arrangement of a system 5a for manufacturing a semiconductor package structure according to some embodiments of the present disclosure. The system 5a of FIG. 20 is similar to the system 5 of FIG. 1, except that a control unit is assembled into the dispensing unit 7. The control unit of the system 5a may include an adjustment unit 76 and a measurement unit. The measurement unit may be an electronic weight scale, and may be used for measuring a weight of the molding powder 3 (or the first molding powder 31) in the case 74. Thus, the amount of the molding powder 3 (or the first molding powder 31) in the case 74 of the dispensing unit 7 may be controlled in the stage of FIG. 8. In some embodiments, the measurement unit may be used for measuring a volume of the molding powder 3 (or the first molding powder 31) in the case 74.

The adjustment unit 76 may be used for adjusting the amount of the molding powder 3 in the case 74 according to the measurement result of the measurement unit and the predetermined amount. In some embodiments, the adjustment unit 76 may include an input apparatus 761 and an output apparatus 762. The input apparatus 761 may be used for adding the molding powder 3 (or the first molding powder 31) into the case 74 to increase the amount of the molding powder 3 (or the first molding powder 31) in the case 74. For example, the input apparatus 761 may include an input suction pressure provider and an input channel 7611. The input channel 7611 may communicate the supply tank 53 and the case 74. Thus, the molding powder 3 (or the first molding powder 31) may be supplied to the case 74 from the supply tank 53 through the input channel 7611 under the control of the input suction pressure provider.

Further, the output apparatus 762 may be used for removing a portion of the molding powder 3 (or the first molding powder 31) from the case 74. The output apparatus 762 may include an output suction pressure provider and an output channel 7621. The output channel 7621 may communicate the recycle tank 54 and the case 74. Thus, the molding powder 3 (or the first molding powder 31) may be removed from the case 74 to the recycle tank 54 through the output channel 7621 under the control of the output suction pressure provider. The output channel 7621 may be an output pipe.

Figure 21:
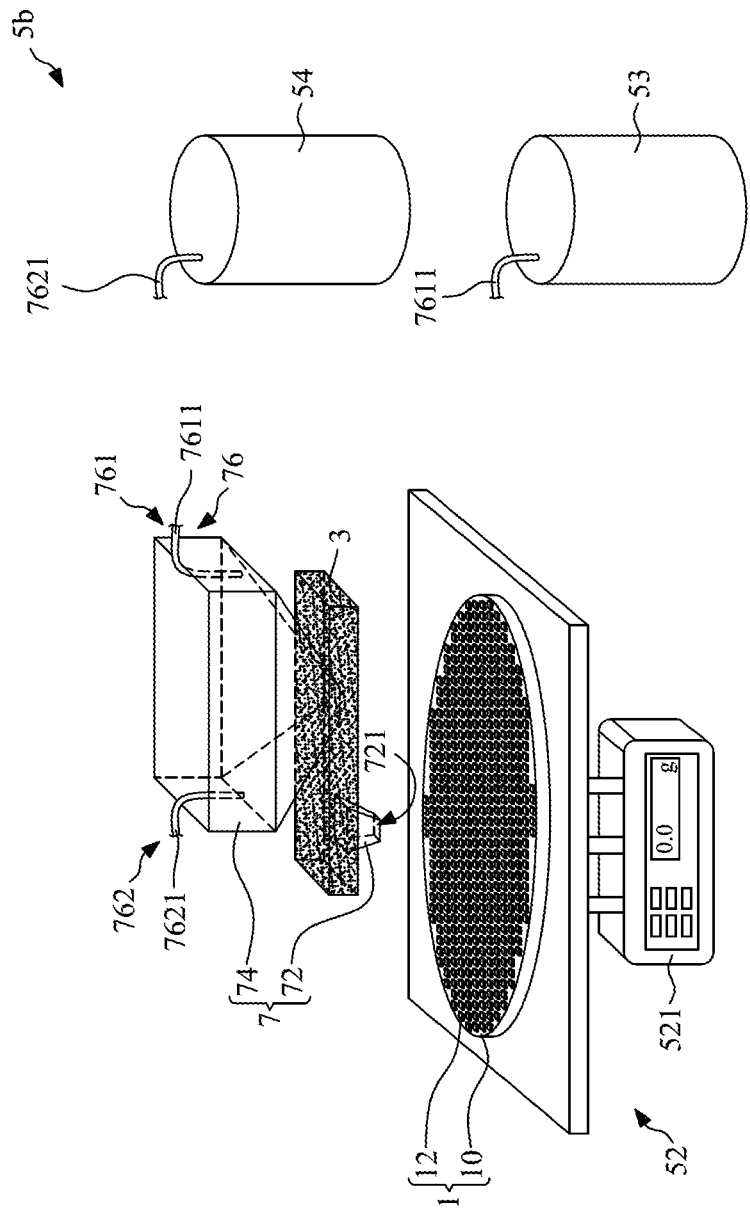
FIG. 21 illustrates a schematic arrangement of a system 5a for manufacturing a semiconductor package structure according to some embodiments of the present disclosure.

FIG. 21 illustrates a schematic arrangement of a system 5b for manufacturing a semiconductor package structure according to some embodiments of the present disclosure. In the system 5b of FIG. 21, the container 62, the measurement unit 64, the adjustment unit 66 and the delivery apparatus 8 of FIG. 20 are omitted. Thus, the molding powder 3 (or the first molding powder 31) is directly provided to the case 74 of the dispensing unit 7 from the supply tank 53.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, a characteristic or quantity can be deemed to be "substantially" consistent if a maximum numerical value of the characteristic or quantity is within a range of variation of less than or equal to +10% of a minimum numerical value of the characteristic or quantity, such as less than or equal to +5%, less than or equal to +4%, less than or equal to +3%, less than or equal to +2%, less than or equal to +1%, less than or equal to +0.5%, less than or equal to +0.1%, or less than or equal to +0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
    providing a carrier and a semiconductor device disposed on the carrier;
    dispensing a first molding powder having a first amount on a first region of the carrier;
    controlling a second amount of a second molding powder, according to a result of weighing the second molding powder, after dispensing the first molding powder; and
    dispensing the second molding powder on a second region of the carrier distinct from the first region of the carrier after controlling the second amount of the second molding powder.

2. The method of claim 1, wherein controlling the second amount of the second molding powder includes:
    supplying the second molding powder by a container; and
    measuring a weight of the second molding powder in the container.

3. The method of claim 2, wherein controlling the second amount of the second molding powder further includes:
    increasing or removing the second molding powder.

4. The method of claim 3, further comprising:
    controlling the first amount of the first molding powder, according to a result of weighing the first molding powder, before dispensing the first molding powder on the first region of the carrier.

5. The method of claim 2, further comprising:
    delivering the container to a position adjacent to a dispensing unit configured to dispense the second molding powder on the second region of the carrier.

6. The method of claim 5, further comprising:
    pouring the second molding powder into the dispensing unit and vibrating the container.

7. The method of claim 1, wherein the step of controlling the second amount of the second molding powder further includes adding a compensation amount of the second molding powder before dispensing the second molding powder.

8. The method of claim 7, wherein the second region of the carrier is adjacent to and separated from the first region of the carrier.

9. A method for manufacturing a semiconductor package structure, comprising:
    providing a carrier and a semiconductor device disposed on the carrier;
    weighing a first molding powder;
    adjusting an amount of the first molding powder before dispensing the first molding powder on the carrier; and
    dispensing the first molding powder on the carrier after weighing the first molding powder.

10. The method of claim 9, wherein adjusting the amount of the first molding powder includes:
    increasing or decreasing the first molding powder.

11. The method of claim 9, further comprising:
    after weighing the first molding powder, delivering the first molding powder to a dispensing unit configured to dispense the first molding powder on the carrier.

12. The method of claim 11, wherein weighing the first molding powder includes:
    supplying the first molding powder into a container; and
    placing the container on a measurement unit to measure a first weight of the first molding powder.

13. The method of claim 12, further comprising:
    pouring the first molding powder from the container to into the dispensing unit.

14. The method of claim 13, further comprising:
    vibrating the container to reduce the first molding powder remaining in the container after pouring.

15. The method of claim 9, further comprising:
    weighing the first molding powder dispensed on the carrier;
    defining a compensation weight according to a weight difference between weighing before and after dispensing the first molding powder; and
    dispensing a third molding powder of the compensation weight on the carrier.

16. A method for manufacturing a semiconductor package structure, comprising:
    providing a carrier and a semiconductor device disposed on the carrier;
    weighing a first molding powder;
    dispensing the first molding powder on the carrier after weighing the first molding powder;
    weighing a second molding powder after dispensing the first molding powder on the carrier; and
    dispensing the second molding powder on the carrier after weighing the second molding powder.

17. The method of claim 16, wherein dispensing the first molding powder includes dispensing the first molding powder on the carrier along a first path, wherein dispensing the second molding powder includes dispensing the second molding powder on the carrier along a second path, wherein the first path is around the second path.

18. The method of claim 17, wherein the first path and the second path are concentric and within different regions respectively.

19. The method of claim 17, wherein the first path is adjacent to the second path.

* * * * *